US009699921B2

(12) United States Patent
Okamoto

(10) Patent No.: US 9,699,921 B2
(45) Date of Patent: Jul. 4, 2017

(54) MULTI-LAYER WIRING BOARD

(71) Applicant: FUJIKURA LTD., Tokyo (JP)

(72) Inventor: Masahiro Okamoto, Tokyo (JP)

(73) Assignee: FUJIKURA LTD., Tokyo (JP)

( * ) Notice: Subject to any disclaimer, the term of this patent is extended or adjusted under 35 U.S.C. 154(b) by 265 days.

(21) Appl. No.: 14/449,662

(22) Filed: Aug. 1, 2014

(65) Prior Publication Data
US 2016/0037630 A1 Feb. 4, 2016

(51) Int. Cl.
*H05K 7/00* (2006.01)
*H05K 3/46* (2006.01)
*H05K 1/14* (2006.01)
*H05K 3/42* (2006.01)

(52) U.S. Cl.
CPC ......... *H05K 3/4614* (2013.01); *H05K 3/4602* (2013.01); *H01L 2224/16225* (2013.01); *H01L 2924/15184* (2013.01); *H01L 2924/15311* (2013.01); *H05K 1/141* (2013.01); *H05K 3/427* (2013.01); *H05K 3/4694* (2013.01)

(58) Field of Classification Search
CPC ... H01L 23/49822–23/49827; H01L 231/4857
USPC ................ 174/250–264; 361/763–766, 790, 361/792–795
See application file for complete search history.

(56) References Cited

U.S. PATENT DOCUMENTS 6,329,610 B1 * 12/2001 Takubo ............. H01L 23/49827
174/255
2006/0191133 A1 8/2006 Nakao et al.
2007/0029106 A1 * 2/2007 Kato ................. H01L 23/49822
174/255
2007/0086147 A1 * 4/2007 Kawamura .......... B23K 3/0623
361/600
2007/0256858 A1 11/2007 Kariya et al.
2008/0277150 A1 * 11/2008 Takashima .......... H01L 21/4857
174/260

(Continued)

FOREIGN PATENT DOCUMENTS

JP 11-317582 A 11/1999
JP 2007-103789 A 4/2007
JP 2008-60609 A 3/2008

(Continued)

*Primary Examiner* — Tuan T Dinh
(74) *Attorney, Agent, or Firm* — Westerman, Hattori, Daniels & Adrian, LLP

(57) ABSTRACT

A multi-layer wiring board that has stacked therein a first printed wiring bases on at least one surface of which a wiring pattern is formed and in which a conductive paste via is formed, that includes an electronic component terminal and a board terminal whose terminal pitch differs from that of the electronic component terminal, and that has an electronic component installed thereon via the electronic component terminal, wherein a second wiring base whose wiring pitch is smaller than that of the first wiring base is built in to a lower portion of an installing portion of the electronic component via the first wiring base, and the second wiring base is connected to the electronic component terminal via the conductive paste via of the first wiring base, has formed on both surfaces thereof a pattern that enlarges the terminal pitch from the electronic component terminal to the board terminal, and includes a via that connects the pattern of the both surfaces.

8 Claims, 8 Drawing Sheets

(56) References Cited

U.S. PATENT DOCUMENTS

2009/0283312 A1    11/2009  Takahashi
2011/0018144 A1*    1/2011  Horiuchi .......... H01L 23/49827
                                                      257/784

FOREIGN PATENT DOCUMENTS

| JP | 2011-159855 A | 8/2011 |
| JP | 5261756 B | 8/2013 |
| JP | 2013-211479 A | 10/2013 |
| WO | 2007/129545 A1 | 11/2007 |
| WO | 2009/141928 A1 | 11/2009 |

* cited by examiner

MULTI-LAYER WIRING BOARD

STATEMENT REGARDING PRIOR DISCLOSURES BY THE INVENTOR OR A JOINT INVENTOR UNDER 37 C.F.R. 1.77(b)(6)

Japanese Patent No. P5261756 was published on Aug. 14, 2013. The inventor of the Japanese Patent No. P5261756 is Masahiro OKAMOTO who is the inventor of the present application. The applicant, Fujikura Ltd., of the Japanese Patent No. P5261756 is an assignee who obtained the invention of the Japanese Patent from the present inventor. A copy of the Japanese Patent is provided on a concurrently filed Information Disclosure Statement pursuant to the guidance of 78 Fed. Reg. 11076 (Feb. 14, 2013).

Japanese Patent Application Publication No. 2013-211479 A was published on Oct. 10, 2013. The inventor of the Japanese Patent Application Publication No. 2013-211479 A is Masahiro OKAMOTO who is the inventor of the present application. The applicant, Fujikura Ltd., of the Japanese Patent Application Publication No. 2013-211479 A is an assignee who obtained the invention of the Japanese Patent Application Publication from the present inventor. A copy of the Japanese Patent Application Publication is provided on a concurrently filed Information Disclosure Statement pursuant to the guidance of 78 Fed. Reg. 11076 (Feb. 14, 2013).

BACKGROUND OF THE INVENTION

Field of the Invention

This invention relates to a multi-layer wiring board having an electronic component installed thereon.

Description of the Prior Art

Along with miniaturization of electronic devices in recent years, an increase in the density or miniaturization of electronic components in semiconductor chips, and so on, and narrowing of pitch of electronic component terminals, have been proceeding. Accompanying this, reduction or miniaturization of mounting area of wiring bases on which electronic components are mounted, has also been progressing. Under such current circumstances, multi-layering of wiring bases is also being pushed forward, and securing reliability of connection in inter-layer connection has become an essential requirement.

A multi-layer wiring board of a structure where wiring bases are multi-layered is sometimes employed, for example, as a board comprising an interposer for mounting an electronic component having a fine wiring pitch on a mounting board whose wiring pitch is comparatively coarse, such as a mother board (refer to International Patent Publication No. WO2007/129545 and Japanese Patent Publication No. 2008-60609).

However, in the multi-layer wiring board of conventional technology disclosed in the above-mentioned International Patent Publication No. WO2007/129545, a heat-resistant base which is the interposer is configured from a silicon (Si) base. Hence the more the number of electronic component terminals increases, the more difficult thinning is, and as a result, there is a problem that thickness of the board as a whole ends up increasing. In addition, the above-described conventional technology is basically build-up type, and also has a high manufacturing cost.

Moreover, in the multi-layer wiring board of conventional technology disclosed in the above-mentioned Japanese Patent Publication No. 2008-60609, the interposer configured from a printed base is disposed in an outermost layer, hence has room for improvement regarding cost and physical stability.

SUMMARY OF THE INVENTION

This invention has an object of overcoming the above-mentioned problems due to the conventional technology to provide a multi-layer wiring board in which thinning can be achieved at low cost and reliability of connection can be improved without lowering board strength.

A multi-layer wiring board according to an embodiment of the present invention, that has stacked therein a first wiring base on at least one surface of which a wiring pattern is formed and in which a conductive paste via is formed, that includes an electronic component terminal and a board terminal whose terminal pitch differs from that of the electronic component terminal, and that has an electronic component installed thereon via the electronic component terminal, wherein a second wiring base whose wiring pitch is smaller than that of the first wiring base is built in to a lower portion of an installing portion of the electronic component via the first wiring base; and the second wiring base is connected to the electronic component terminal via the conductive paste via of the first wiring base, has formed on both surfaces thereof a pattern that enlarges the terminal pitch from the electronic component terminal to the board terminal, and includes a via that connects the pattern of the both surfaces.

The multi-layer wiring board according to the embodiment of the present invention results in a board in which a second wiring base acting as an interposer is built in to a lower portion of an installing portion of an electronic component via a first wiring base, and the second wiring base has formed on both surfaces thereof a pattern that enlarges a terminal pitch from an electronic component terminal to a board terminal, and includes a via that connects the pattern of the both surfaces. In this way, the second wiring base acting as the interposer connected to the electronic component is built in a similar step to a built-in electronic component when stacking the first wiring base in which a conductive paste via is formed, hence thinning can be achieved at lower cost compared to in a conventional board, and reliability of connection can be improved without lowering board strength.

In an embodiment of the multi-layer wiring board, the first wiring base and the second wiring base are formed by a resin base.

In another embodiment of the multi-layer wiring board, an outermost electronic component terminal of the electronic component terminals has its terminal pitch enlarged by a pattern continuous with the electronic component terminal of the first wiring base on which the electronic component is installed, to be connected to the board terminal via the conductive paste via without being mediated by the second wiring base.

A multi-layer wiring board according to another embodiment of the present invention, that has stacked therein, via an adhesive layer, a plurality of wiring bases on at least one surface of which a wiring pattern is formed and in which a conductive paste via is formed, that includes an electronic component terminal and a board terminal whose terminal pitch differs from that of the electronic component terminal, and that has an electronic component installed thereon via the electronic component terminal, wherein the plurality of wiring bases include a first wiring base, a second wiring base, a third wiring base, and a fourth wiring base of similar thicknesses; the second wiring base includes an opening in which the fourth wiring base is housed, and is disposed, along with the fourth wiring base housed in the opening, between the first wiring base and the third wiring base; and the fourth wiring base has a smaller wiring pitch than those of the first wiring base, the second wiring base, and the third wiring base, is built in to between the first wiring base at a lower portion of an installing portion of the electronic component and the third wiring base, is connected to the electronic component terminal via the conductive paste via of the first wiring base, has formed on both surfaces thereof a pattern that enlarges the terminal pitch from the electronic component terminal to the board terminal, and includes a via that connects the pattern of the both surfaces.

The multi-layer wiring board according to the other embodiment of the present invention results in a board in which a fourth wiring base acting as an interposer is built in to a lower portion of an installing portion of an electronic component via a first wiring base, and the fourth wiring base has formed on both surfaces thereof a pattern that enlarges a terminal pitch from an electronic component terminal to a board terminal, and includes a via that connects the pattern of the both surfaces. In this way, the fourth wiring base acting as the interposer connected to the electronic component is built in a similar step to a built-in electronic component when stacking the first wiring base in which a conductive paste via is formed, hence thinning can be achieved at lower cost compared to in a conventional board, and reliability of connection can be improved without lowering board strength.

In yet another embodiment of the multi-layer wiring board, the fourth wiring base is a single layer, and, moreover, the first wiring base, the second wiring base, the third wiring base, and the fourth wiring base are formed by a resin base.

In yet another embodiment of the multi-layer wiring board, an outermost electronic component terminal of the electronic component terminals has its terminal pitch enlarged by a pattern continuous with the electronic component terminal of the first wiring base on which the electronic component is installed, to be connected to the board terminal via the conductive paste via without being mediated by the fourth wiring base.

The accompanying drawings, which are incorporated in and constitute a part of the specification, illustrate embodiments of the invention, and together with the general description given above and the detailed description of the embodiments given below, serve to explain the principles of the invention.

DESCRIPTION OF THE PREFERRED EMBODIMENTS

A multi-layer wiring board according to an embodiment of this invention will be described in detail below with reference to the accompanying drawings.

Figure 1:
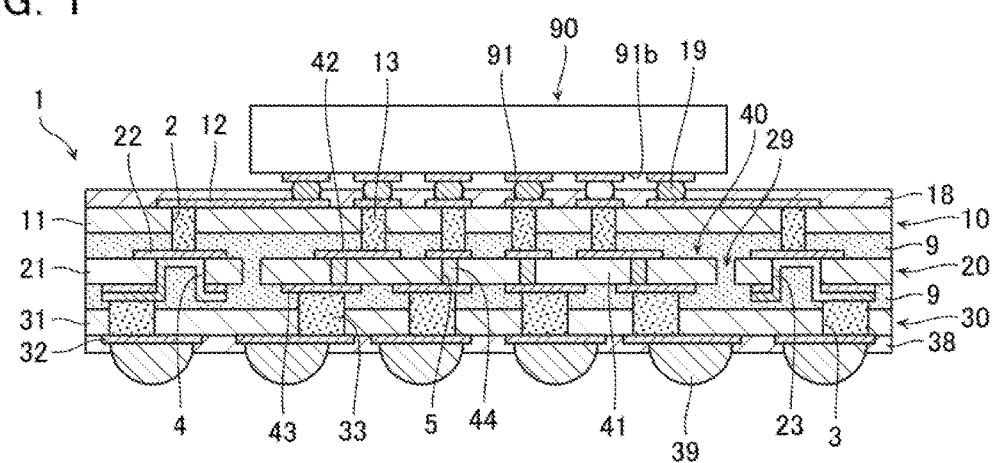
FIG. 1 is a cross-sectional view showing a structure of a multi-layer wiring board according to an embodiment of the present invention.

FIG. 1 is a cross-sectional view showing a structure of a multi-layer wiring board according to an embodiment of the present invention. As shown in FIG. 1, a multi-layer wiring board 1 according to the present embodiment comprises a multi-layer structure in which a first printed wiring base 10 which is a first wiring base, a second printed wiring base 20, and a third printed wiring base 30 are stacked collectively by thermal compression bonding.

In addition, the multi-layer wiring board 1 comprises a fourth printed wiring base 40 which is a second wiring base built in to an opening 29 formed in a second resin base 21 of the second printed wiring base 20, in a state of being sandwiched between the first and third printed wiring bases 10 and 30. As will be mentioned later, a wiring pitch of the fourth printed wiring base 40 is far smaller than those of the first through third printed wiring bases 10, 20, and 30. Note that the multi-layer wiring board 1 comprises an electronic component 90 mounted on the first printed wiring base 10.

The first through third printed wiring bases 10 to 30 respectively comprise: a first resin base 11, the second resin base 21, and a third resin base 31; and wirings 12, 22, and 32 formed on at least one surface of these first through third resin bases 11 to 31. In addition, the first and third printed wiring bases 10 and 30 respectively comprise conductive paste vias 13 and 33 formed by filling in via holes 2 and 3 of diameter of about 50 to 150 μm formed in the first and third resin bases 11 and 31.

Furthermore, the second printed wiring base 20 comprises a plated via 23 formed in a via hole 4 of diameter of about 100 μm formed in the second resin base 21 so as to provide conduction between both surfaces of the second resin base 21. Employable as these first through third printed wiring bases 10 to 30 are, for example, a single-sided copper clad laminated board (single-sided CCL) or a double-sided copper clad laminated board (double-sided CCL), and so on.

In the present example, the second printed wiring base 20 is formed based on a double-sided CCL, and the other first and third printed wiring bases 10 and 30 are formed based on a single-sided CCL. Therefore, the wiring 22 of the second printed wiring base 20 is formed on the both surfaces of the second resin base 21, and the plated via 23 provides inter-layer connection between the wirings 22 of these both surfaces.

Note that the plated via 23 is configured from, for example, an LVH plated via having a structure in which a plating is applied in a through-hole formed from a side of one of the wirings 22 without penetrating the other of the wirings 22, and is formed by, for example, a copper (Cu) plating. Therefore, a plated layer is formed on one of the wirings 22.

In addition, although omitted from illustration, it is also possible to form a via having a structure in which the inside of the through-hole is filled with a conductive paste instead of the plated via 23 where the inside of the through-hole is plated, or to form a plated through-hole having a structure in which a plating is applied in a through-hole that penetrates between the wirings 22.

On the other hand, the fourth printed wiring base 40 comprises: a fourth resin base 41; wiring patterns 42 and 43 formed on both surfaces of this fourth resin base 41; and a filled plated via 44 formed by plating inside a via hole 5 of diameter of about 10 to 30 μm formed in the fourth resin base 41 to provide conduction between these wiring patterns 42 and 43.

The wiring patterns 42 and 43 are formed in a pattern such as to enlarge a connection pitch between the electronic component 90 and the multi-layer wiring board 1, and are here formed such that a pattern pitch of the lower wiring pattern 43 is broader than a pattern pitch of the upper wiring pattern 42. In the present example, whereas a wiring pitch of the wirings 12, 22, and 32 of the first through third printed wiring bases 10, 20, and 30 is 80 μm, a wiring pitch of the wiring patterns 42 and 43 of the fourth printed wiring base 40 is set to about 20 μm.

Figure 2:
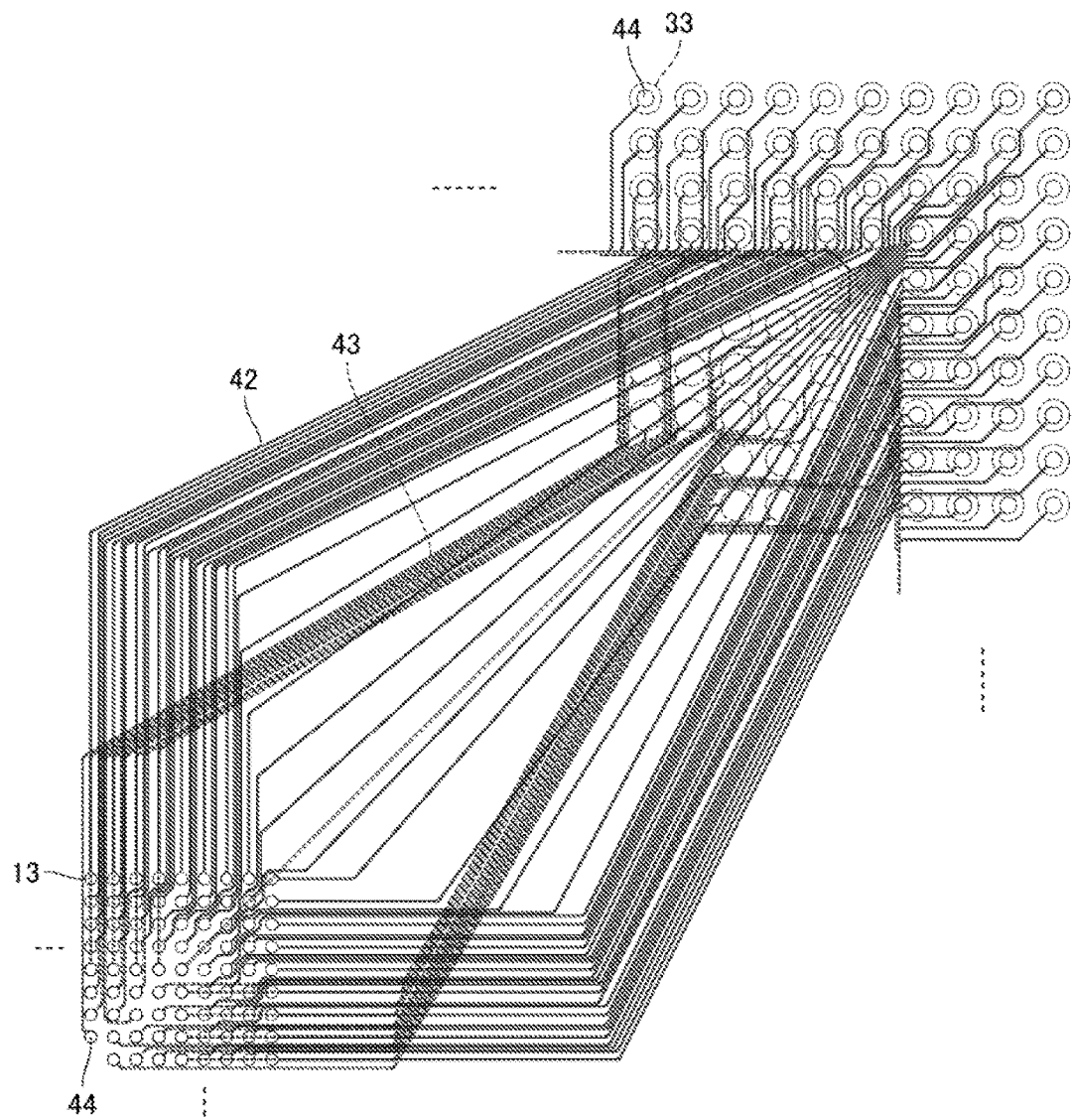
FIG. 2 is a plan view showing part of a wiring pattern of both surfaces in a printed wiring base built in to the same multi-layer wiring board.
Figure 3:
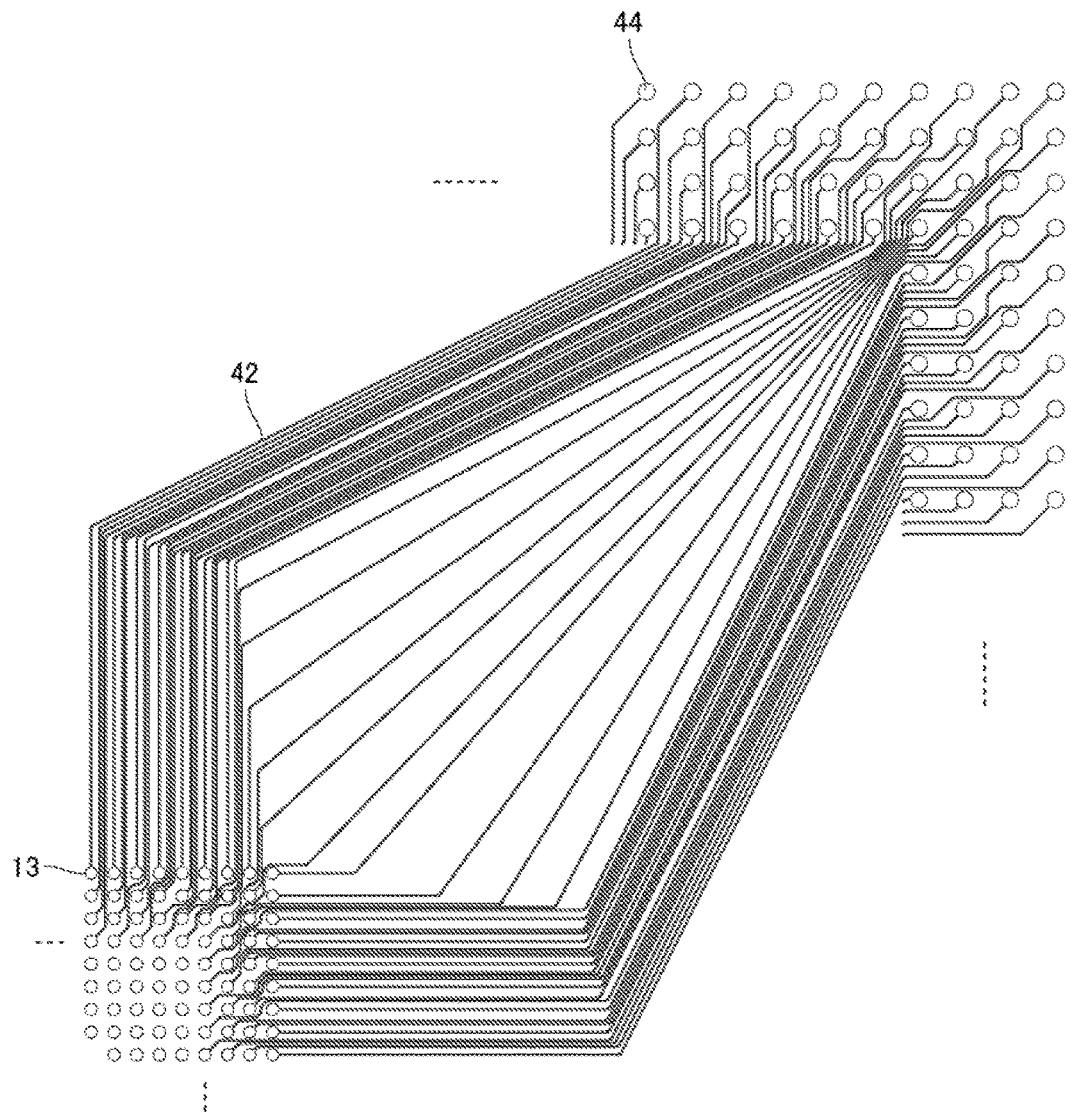
FIG. 3 is a plan view showing part of the wiring pattern of one of the surfaces of the same printed wiring base.
Figure 4:
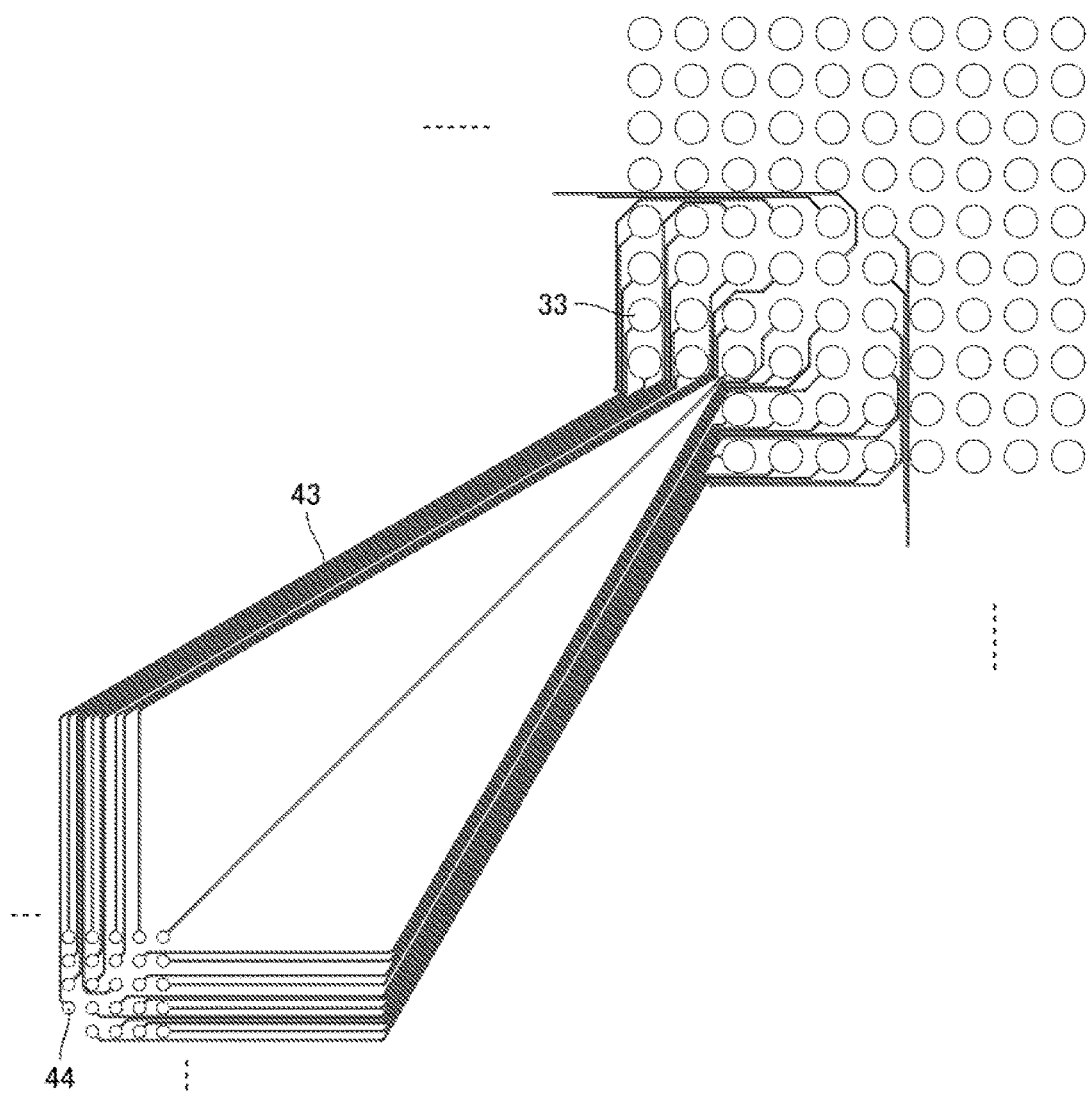
FIG. 4 is a plan view showing part of the wiring pattern of the other of the surfaces of the same printed wiring base.

Now, a mode of arrangement of the wiring patterns 42 and 43 will be described. FIG. 2 is a plan view showing part of the wiring patterns 42 and 43 of the both surfaces in the fourth printed wiring base 40 of the multi-layer wiring board 1. Moreover, FIG. 3 is a plan view showing part of the wiring pattern 42 of one of the surfaces of the fourth printed wiring base 40, and FIG. 4 is a plan view showing part of the wiring pattern 43 of the other of the surfaces of the fourth printed wiring base 40. Note that in order to further facilitate understanding of the mode of arrangement of the wiring patterns 42 and 43, the wiring patterns 42 and 43 in these FIGS. 2 to 4 are displayed with layouts or dimensions, and so on, that are different from those of the fourth printed wiring base 40 in FIG. 1. Note that the illustrated example shows part of a corner portion of the wiring patterns 42 and 43, and that in reality, a similar pattern continues also downward in a vertical direction and leftward in a horizontal direction.

That is, as shown in FIG. 2, the wiring patterns 42 and 43 are pattern formed such that their respective pattern pitches in the fourth resin base 41 are different, hence as illustrated, it becomes possible for the wiring patterns 42 and 43 to be extremely finely laid out to be led out outwardly in a planar direction. Depending on design conditions of layout, for example, a terminal pitch of an 8 row by 8 column portion of electronic component terminals 19 in the wiring pattern 42 of one of the surfaces can be enlarged, hence together with the wiring pattern 43 of the other of the surfaces, it becomes possible for a terminal pitch of a 16 row by 16 column portion to be enlarged in a thickness of a single-layer portion. Achieving such a fine layout by the likes of a silicon interposer results in thickness significantly increasing, but, as shown in FIGS. 3 and 4, the multi-layer wiring board 1 of the present embodiment enables the wiring pitch to be efficiently enlarged without the fine wiring patterns 42 and 43 short-circuiting, and so on, even in a thickness of a single-layer portion.

The first through fourth resin bases 11 to 41 are each formed by, for example, a resin film having a thickness of about 25 μm. Now, employable as the resin film are, for example, a resin film configured from the likes of a polyimide (PI), polyolefin (PO), or liquid crystal polymer (LCP), or a resin film configured from a thermosetting epoxy resin (EP), and so on.

The electronic component 90 is, for example, a semiconductor component such as an IC chip, or a passive component, and so on, and is configured from a WLP (Wafer Level Package) that has been rewired. Provided on an electrode formation surface 91b of the electronic component 90 are a plurality of re-wiring electrodes 91 formed on a pad not illustrated. Moreover, formed on the electrode formation surface 91b in a periphery of the re-wiring electrodes 91 is an insulating layer not illustrated. Note that the wirings 12, 22, and 32 are configured by pattern forming a conductive material such as copper foil.

The conductive paste forming the conductive paste vias 13 and 33 includes at least one kind of metallic particle of low electrical resistance selected from the likes of gold, silver, copper, aluminum, and iron, and at least one kind of metallic particle of low melting point selected from the likes of tin, bismuth, indium, and lead. The conductive paste is configured from, for example, a paste having mixed into these metallic particles a binder component whose main component is an epoxy, an acrylic, a urethane, and so on.

The conductive paste configured in this way enables the metallic particle of low melting point contained therein to melt and form an alloy at a temperature of 200° C. or less, specifically the likes of copper or silver comprise characteristics allowing an inter-metallic compound to be formed. Therefore, a connection between the conductive paste vias 13 and 33, the wirings 12, 22, and 32, the wiring patterns 42 and 43, and the plated via 23 is alloyed by an inter-metallic compound during thermal compression bonding of collective stacking.

In this case, the conductive paste is characterized in that electrical connection is performed by contact between fellow metallic particles. Adoptable as a method of filling the conductive paste into the via holes 2 and 3 is, for example, a printing method, a spin coating method, a spray coating method, a dispensing method, a laminating method, a method combining use of these methods, and so on.

Note that the first through fourth printed wiring bases 10 to 40 are stacked via an adhesive layer 9 provided beforehand in the first and third printed wiring bases 10 and 30. The adhesive layer 9 is configured from, for example, a thermosetting resin or a thermoplastic resin. The wiring patterns 42 and 43 and the filled plated via 44 of the fourth printed wiring base 40 are formed with an extremely fine pitch compared to the wirings 12, 22, and 32, and the conductive paste vias 13 and 33 and the plated via 23 of the first through third printed wiring bases 10 to 30. In addition, the multi-layer wiring board 1 comprises: the electronic component terminal 19 formed on a surface side of the first printed wiring base 10; and a board terminal 39 formed on a reverse side of the third printed wiring base 30.

These electronic component terminal 19 and board terminal 39 are configured from, for example, solder or the like, and are formed on the wiring 12 formed on a surface side of the first resin base 11 of the printed wiring base 10 in a portion thereof not covered by a solder resist 18, or on the wiring 32 formed on a reverse side of the third resin base 31 of the third printed wiring base 30 in a portion thereof not covered by a solder resist 38.

The electronic component terminal 19 is connected to the re-wiring electrode 91 of the electronic component 90, and the board terminal 39 is connected to a land of a mounting board. The electronic component terminal 19 is formed with a narrow terminal pitch matching its arrangement pitch to that of the re-wiring electrode 91, and the board terminal 39 is formed with a terminal pitch broader than the terminal pitch of the electronic component terminal 19.

In the first printed wiring base 10 in the multi-layer wiring board 1 configured in this way, the wiring 12 having formed thereon the electronic component terminal 19 connected to the outermost re-wiring electrode 91 of the electronic component 90, is formed laid out extending outwardly in a planar direction assuming an installing portion of the electronic component 90 to be at the center, and the conductive paste via 13 is formed below a close vicinity to an outer end of that wiring 12.

On the other hand, in the first printed wiring base 10, the wiring 12 having formed thereon another inner electronic component terminal 19, is formed with a layout substantially matched to the arrangement pitch of the re-wiring electrode 91, and the conductive paste via 13 is formed below that wiring 12. Therefore, in this first printed wiring base 10, in a first stage, the wiring 12 and the conductive paste via 13 are formed such that a terminal pitch broadens between the outermost electronic component terminal 19 and an electronic component terminal 19 on the inside thereof.

Next, in the second printed wiring base 20, the wiring 22 and the plated via 23 result in layout being performed such that the conductive paste via 33 connected to the plated via 23 is disposed more outwardly in a planar direction than the conductive paste via 13 connected to the wiring 22. At the same time, in the fourth printed wiring base 40 housed in the opening 29 in the second printed wiring base 20, the conductive paste via 13 formed below the wiring 12 having formed thereon the above-described inner electronic component terminal 19 is connected to the wiring pattern 42.

As mentioned above, the fourth printed wiring base 40 has formed therein the wiring pattern 43 whose pattern pitch is broader than that of this wiring pattern 42 and these wiring patterns 42 and 43 are connected by the filled plated via 44, hence in the fourth printed wiring base 40, layout is performed such that the conductive paste via 33 connected to the wiring pattern 43 is disposed more outwardly in a planar direction than the conductive paste via 13 connected to the wiring pattern 42. Therefore, in the fourth printed wiring base 40, a terminal pitch of the above-mentioned electronic component terminal 19 formed on the inside of the outermost electronic component terminal 19 respectively broadens.

Thus, in a second stage, the second printed wiring base 20 and the fourth printed wiring base 40 built in thereto result in a terminal pitch of substantially all of the electronic component terminals 19 being enlarged. Therefore, in the third printed wiring base 30, the wiring 32 and the board terminal 39 need only be formed so as to match the arrangement pitch of the conductive paste via 33.

Therefore, the multi-layer wiring board 1 according to the present embodiment is more capable of thinning and more capable of suppressing thickness of the board as a whole even when the number of electronic component terminals 19 increases, compared to a conventional silicon interposer. Moreover, the fourth printed wiring base 40 is built in, hence strength of the board as a whole can be more greatly maintained to improve reliability of connection, compared to in a board of the kind where the fourth printed wiring base 40 is disposed in an outermost layer.

Furthermore, the fourth printed wiring base 40 is built in to part of the second printed wiring base 20, hence can be formed at a cheaper price compared to the case where the entire second printed wiring base 20 is formed with a fine pitch like the fourth printed wiring base 40. Therefore, thinning can be achieved at low cost and reliability of connection can be improved without lowering board strength. Note that if it becomes possible to manufacture the fourth printed wiring base 40 at a cheap price, a structure may be adopted in which the fourth printed wiring base 40 is disposed on an entire surface between the first and third printed wiring bases 10 and 30, instead of in the second printed wiring base 20.

Next, a manufacturing method of the multi-layer wiring board 1 according to the present embodiment will be described.

FIGS. 5 to 8 are each a flowchart showing a manufacturing process of the multi-layer wiring board 1. FIGS. 9A, 9B, 9C, 9D, 9E, 10A, 10B, 10C, 10D, 10E, 11A, 11B, 11C, 11D, 12A, 12B, and 12C are each a cross-sectional view showing the multi-layer wiring board 1 on a manufacturing process basis. Note that FIGS. 5 and 9A to 9E show the manufacturing process of the first printed wiring base 10; FIGS. 6 and 10A to 10E show the manufacturing process of the second printed wiring base 20; FIGS. 7 and 11A to 11D show the manufacturing process of the fourth printed wiring base 40; and FIGS. 8 and 12A to 12C show the manufacturing process of a final process of the multi-layer wiring board 1. The third printed wiring base 30 can be manufactured by a similar process to the manufacturing process of the first printed wiring base 10, hence unless specifically mentioned, a description of the manufacturing process of the third printed wiring base 30 will be omitted.

Figure 5:
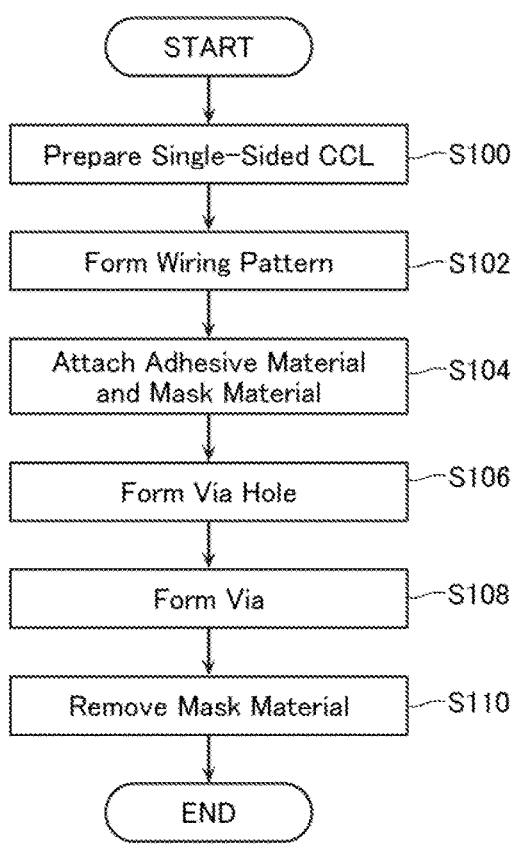
FIG. 5 is a flowchart showing a manufacturing process of the same multi-layer wiring board.
Figure 9A:
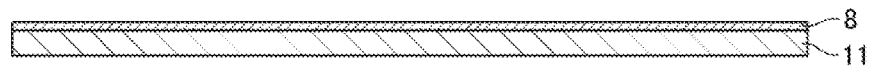
FIG. 9A is a cross-sectional view showing the same multi-layer wiring board on a manufacturing process basis.
Figure 9B:
FIG. 9B is a cross-sectional view showing the same multi-layer wiring board on a manufacturing process basis.

First, the manufacturing process of the first printed wiring base 10 will be described with reference to FIG. 5. As shown in FIG. 9A, a single-sided CCL in which a conductor layer 8 configured from the likes of a solid-state copper foil is formed on one surface of the first resin base 11, is prepared (step S100). Next, an etching resist is formed on the conductor layer 8 by photolithography, and then, as shown in FIG. 9B, etching is performed to form a wiring pattern of the wiring 12, and so on (step S102).

The single-sided CCL used in step S100 is, for example, configured from a structure in which the first resin base 11 having a thickness of about 25 μm is affixed to the conductor layer 8 configured from copper foil having a thickness of about 12 µm. Usable as this single-sided CCL is, for example, a single-sided CCL prepared by applying a varnish of polyimide to copper foil and hardening the varnish, by a publicly known casting method.

Otherwise employable as the single-sided CCL are the likes of a single-sided CCL in which a seed layer is formed on a polyimide film by sputtering and the conductor layer 8 is formed by growing copper by plating, or a single-sided CCL prepared by attaching a rolled or electrolytic copper foil and a polyimide film by an adhesive material.

Note that the first resin base 11 is not necessarily required to be configured from a polyimide, and as described above, may be configured from a plastic film of a liquid crystal polymer, or the like. Moreover, an etchant whose main component is the likes of ferric chloride or cupric chloride may be employed in the etching in step S102.

Figure 9C:
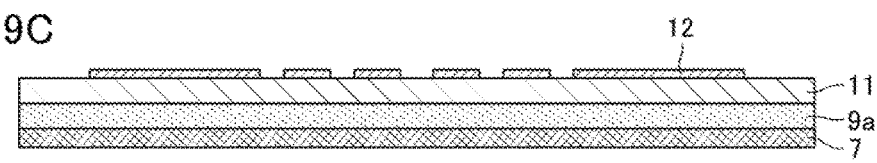
FIG. 9C is a cross-sectional view showing the same multi-layer wiring board on a manufacturing process basis.

As shown in FIG. 9C, after the wiring 12 has been formed, an adhesive material 9a and a mask material 7 are attached, by thermal compression bonding, to a surface on an opposite side to a side of formation of the wiring 12 of the first resin base 11 (step S104). Employable as the adhesive material 9a attached in step S104 is, for example, an epoxy system thermosetting film having a thickness of about 25 µm. The thermal compression bonding includes employing a vacuum laminator to press and attach these in a reduced pressure atmosphere, at a temperature where the adhesive material 9a does not harden, by a pressure of 0.3 MPa.

Note that an inter-layer adhesive material employed in the adhesive layer 9 or the adhesive material 9a includes not only an epoxy system thermosetting resin, but also the likes of an acrylic system adhesive material or a thermoplastic adhesive material typified by a thermoplastic polyimide, or the like. Moreover, the inter-layer adhesive material is not necessarily required to be in a film state, and may have resin coated in a varnish state. Employable as the mask material 7 are various kinds of films capable of adhesion or detachment by UV irradiation, as well as the above-mentioned resin film or plastic film of PET, PEN, and so on.

Then, a UV-YAG laser device, for example, is employed to irradiate laser light from an attached mask material 7 side toward the wiring 12, whereby the via hole 2 penetrating the mask material 7, the adhesive material 9a, and the first resin base 11 is formed at a certain place (step S106). The via hole 2 at this time is formed such that its diameter is about 50 µm to 150 µm. Note that desmear processing such as plasma desmear is performed in the via hole 2 after formation of the via hole 2.

The via hole 2 formed in step S106 may otherwise by formed by the likes of a carbon dioxide laser ($CO_2$ laser) or an excimer laser, or may be formed by the likes of drill processing or chemical etching. Moreover, the desmear processing can be performed by a mixed gas of $CF_4$ and $O_2$ (tetrafluoromethane+oxygen), but may also employ another inert gas such as Ar (argon), and may be configured as wet desmear processing employing a chemical, rather than so-called dry processing.

Figure 9D:
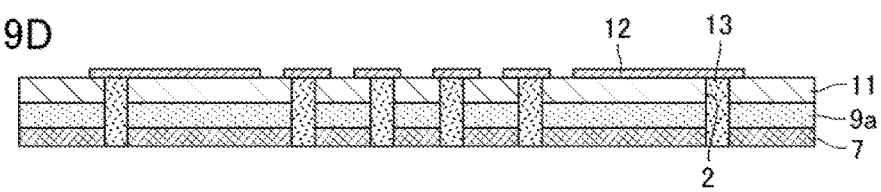
FIG. 9D is a cross-sectional view showing the same multi-layer wiring board on a manufacturing process basis.
Figure 9E:
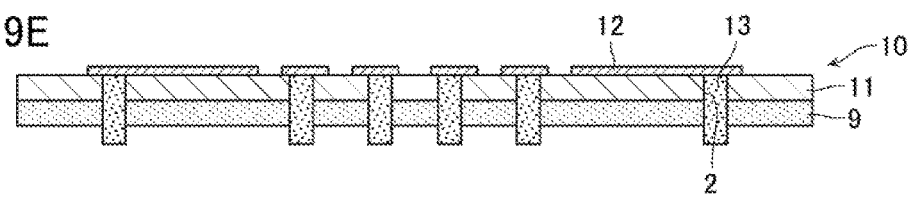
FIG. 9E is a cross-sectional view showing the same multi-layer wiring board on a manufacturing process basis.

Then, as shown in FIG. 9D, the conductive paste is filled into the formed via hole 2 by, for example, screen printing, to form the conductive paste via 13 (step S108) and the mask material 7 is removed by peeling (step S110), thereby forming, as shown in FIG. 9E, the first printed wiring base 10 including the first resin base 11 having formed thereon/therein the wiring 12 and the conductive paste via 13 and provided with the adhesive layer 9. Note that processing similar to that described above is performed to manufacture and prepare the third printed wiring base 30 that includes the wiring 32 or conductive paste via 33 whose size or arrangement pitch are different.

Figure 6:
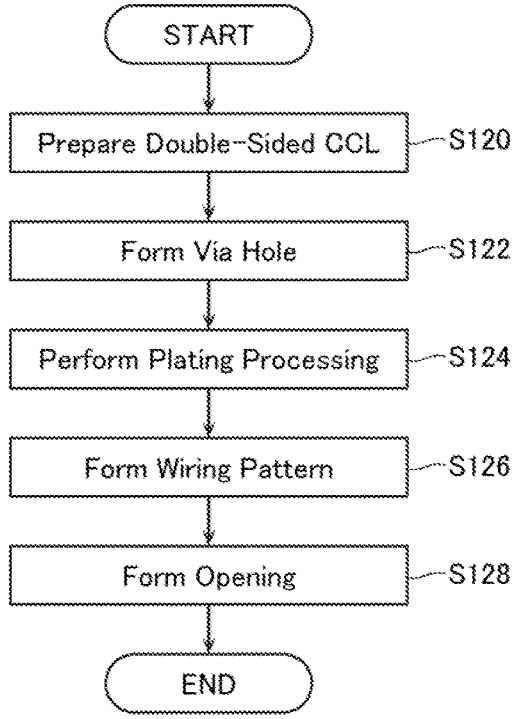
FIG. 6 is a flowchart showing a manufacturing process of the same multi-layer wiring board.
Figure 10A:
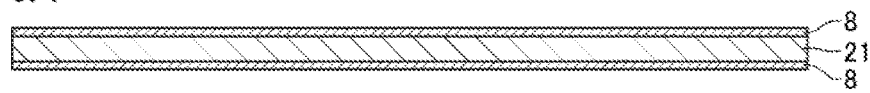
FIG. 10A is a cross-sectional view showing the same multi-layer wiring board on a manufacturing process basis.
Figure 10B:
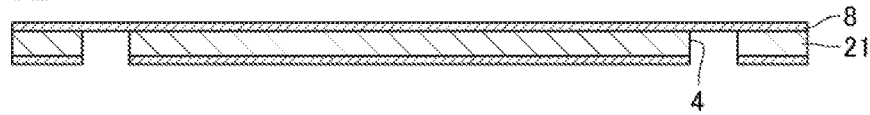
FIG. 10B is a cross-sectional view showing the same multi-layer wiring board on a manufacturing process basis.

Next, the manufacturing process of the second printed wiring base 20 will be described with reference to FIG. 6. Note that places already described are assigned with identical symbols and a description of such places will sometimes be omitted, and that the above-described content is assumed to be applicable to specific processing content of each of the steps. First, as shown in FIG. 10A, a double-sided copper clad laminated board (double-sided CCL) in which the conductor layer 8 is formed on both surfaces of the second resin base 21 is prepared (step S120), then, as shown in FIG. 10B, the via hole 4 is formed at a certain place (step S122), and, for example, plasma desmear processing is performed.

Figure 10C:
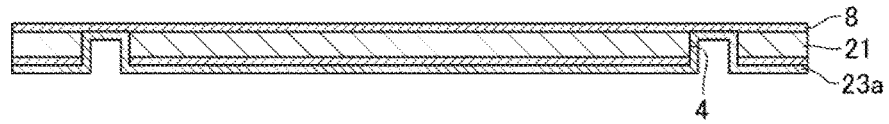
FIG. 10C is a cross-sectional view showing the same multi-layer wiring board on a manufacturing process basis.

Next, as shown in FIG. 10C, panel plate processing is performed on both surfaces of the second resin base 21 (step S124) to form a plating layer 23a on the conductor layer 8 and in the via hole 4. Note that in FIG. 10C, illustration of a plating layer on an upper side of the conductor layer 8 is omitted. The plating layer 23a inside the via hole 4 will be employed later as the plated via 23, and provides electrical conduction between the conductor layers 8 of both surfaces of the second resin base 21.

Figure 10D:
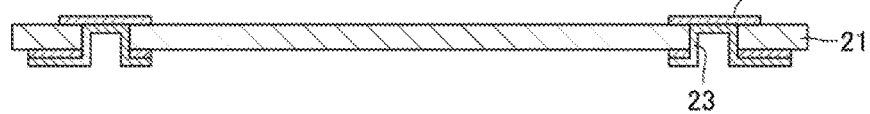
FIG. 10D is a cross-sectional view showing the same multi-layer wiring board on a manufacturing process basis.
Figure 10E:
FIG. 10E is a cross-sectional view showing the same multi-layer wiring board on a manufacturing process basis.

Then, as shown in FIG. 10D, etching, and so on, is performed on both surfaces of the second resin base 21 to form a wiring pattern of the wiring 22 or the plated via 23, and so on (step S126). Finally, as shown in FIG. 10E, the second resin base 21 at a portion thereof where the fourth printed wiring base 40 is to be built in is removed by the likes of a UV laser to form the opening 29 (step S128), thereby forming the second printed wiring base 20.

Figure 7:
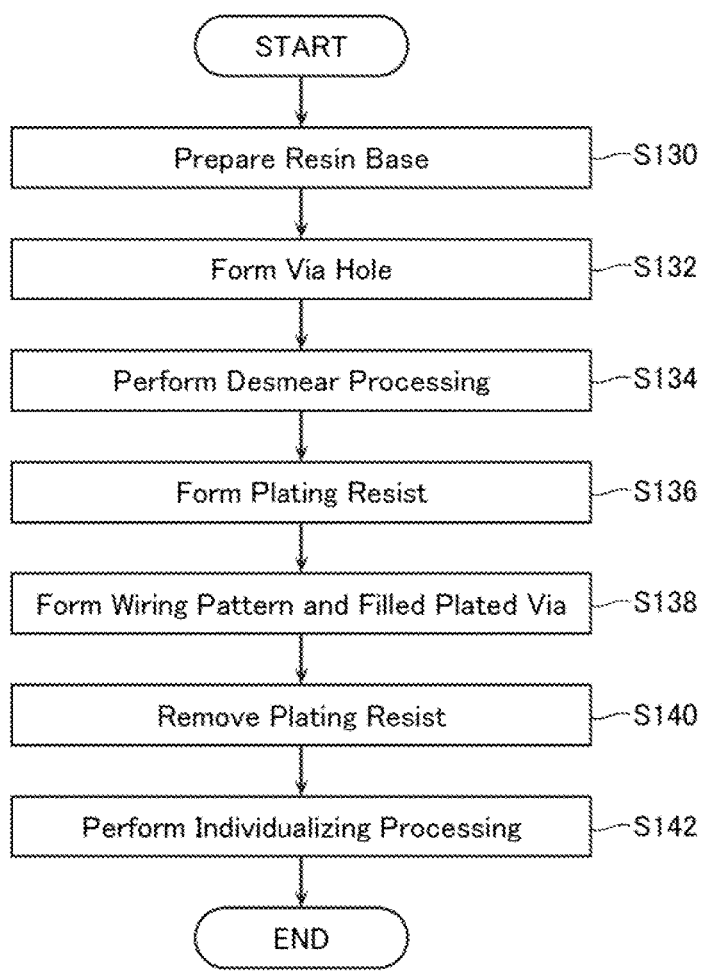
FIG. 7 is a flowchart showing a manufacturing process of the same multi-layer wiring board.

Next, the manufacturing process of the fourth printed wiring base 40 will be described with reference to FIG. 7.

Figure 11A:
FIG. 11A is a cross-sectional view showing the same multi-layer wiring board on a manufacturing process basis.
Figure 11B:
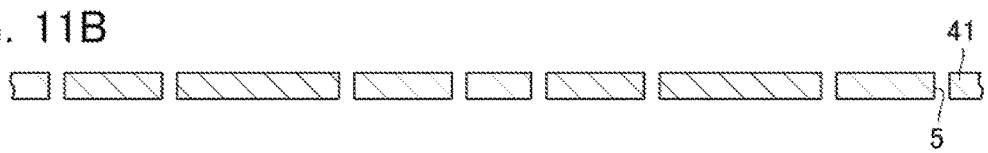
FIG. 11B is a cross-sectional view showing the same multi-layer wiring board on a manufacturing process basis.

As shown in FIG. 11A, first, the fourth resin base 41 configured from the likes of a polyimide resin film is prepared (step S130), and then, as shown in FIG. 11B, an excimer laser or the like is employed to form the via hole 5 having a diameter of about 10 µm to 30 µm at a certain place of the fourth resin base 41 (step S132).

Figure 11C:
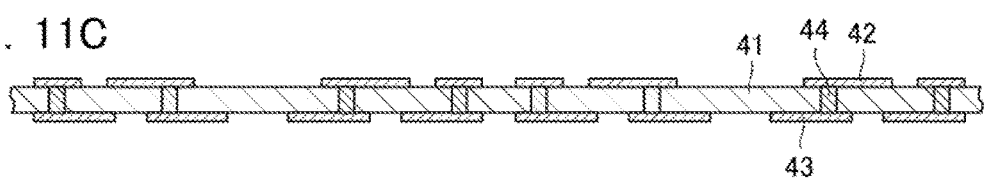
FIG. 11C is a cross-sectional view showing the same multi-layer wiring board on a manufacturing process basis.

After the via hole 5 has been formed, desmear processing such as plasma desmear is performed (step S134) to form a plating resist not illustrated (step S136), and, as shown in FIG. 11C, the wiring patterns 42 and 43 and the filled plated via 44 are formed by, for example, a semi-additive method (step S138).

Figure 11D:
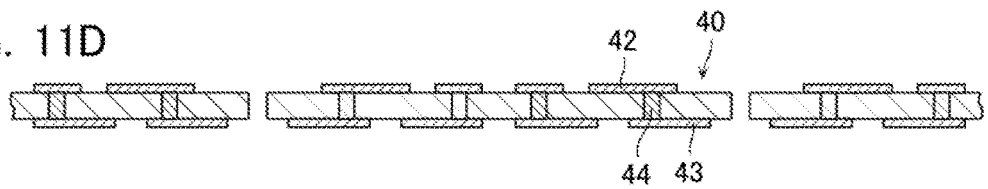
FIG. 11D is a cross-sectional view showing the same multi-layer wiring board on a manufacturing process basis.

Then, the plating resist is removed (step S140), and finally, as shown in FIG. 11D, a device such as a dicer not illustrated is employed to individualize by cutting to a certain size (step S142), thereby manufacturing a plurality of the fourth printed wiring bases 40.

Figure 12A:
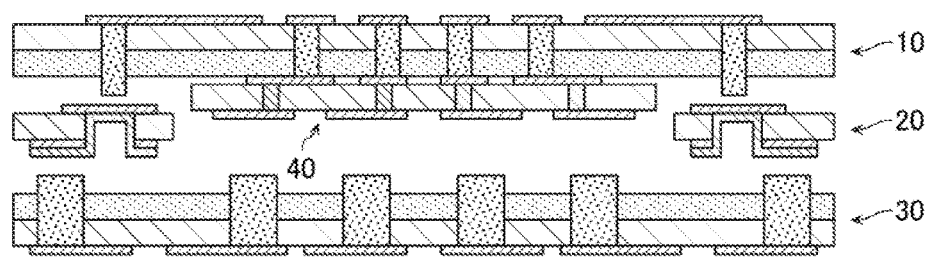
FIG. 12A is a cross-sectional view showing the same multi-layer wiring board on a manufacturing process basis.

When the first through fourth printed wiring bases 10 to 40 have been produced in this way, then as shown in FIG. 12A, the wiring pattern 42 of the fourth printed wiring base 40 and the conductive paste via 13 of the first printed wiring base 10 are aligned using an electronic component mounting device, and the fourth printed wiring base 40 is provisionally adhered to the first printed wiring base 10 in a state where the adhesive layer 9 of the first printed wiring base 10 and the conductive paste of the conductive paste via 13 are unhardened.

Figure 8:
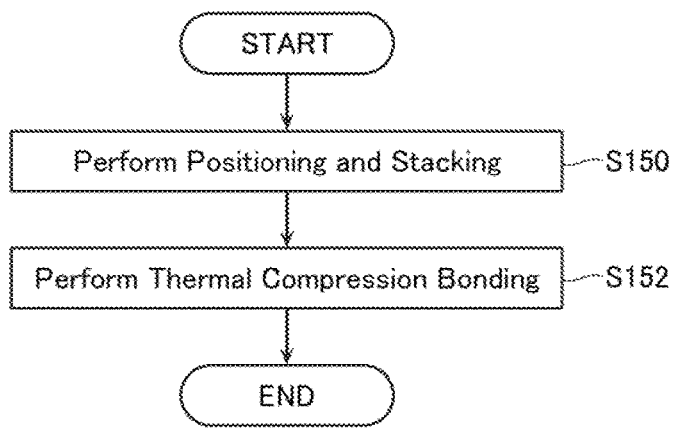
FIG. 8 is a flowchart showing a manufacturing process of the same multi-layer wiring board.
Figure 12B:
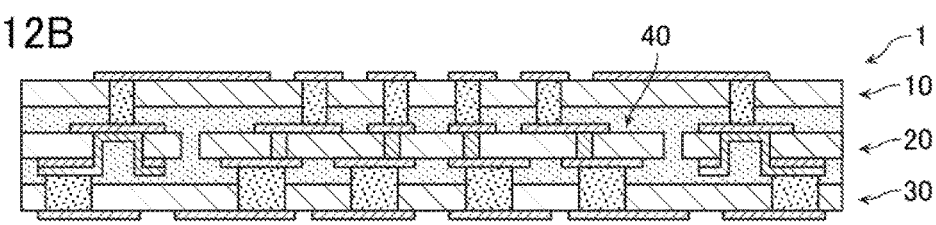
FIG. 12B is a cross-sectional view showing the same multi-layer wiring board on a manufacturing process basis.

Then, as shown in FIG. 8, each of the printed wiring bases 10 to 40 are positioned and stacked (step S150). Then, for example, a vacuum press is employed to collectively stack by thermal compression bonding by applying heat and pressure in a reduced pressure atmosphere of 1 kPa or less (step S152). As a result, the multi-layer wiring board 1 of the kind shown in FIG. 12B is manufactured. At this time, hardening and alloying of the conductive paste filled into the via holes is performed simultaneously to hardening of each of the inter-layer adhesive layers 9 or each of the resin bases 11 to 41, and so on. Therefore, as mentioned above, an alloy layer of an inter-metallic compound is formed between the conductive paste and the wirings contacting the conductive paste, and so on.

Figure 12C:
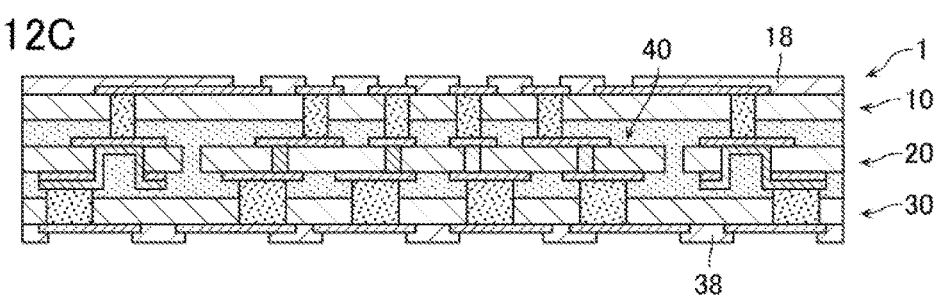
FIG. 12C is a cross-sectional view showing the same multi-layer wiring board on a manufacturing process basis.

Then, as shown in FIG. 12C, the solder resists 18 and 38 are pattern formed on the first and third resin bases 11 and 31 on wirings 12 and 32 sides of the first printed wiring base 10 and the third printed wiring base 30 in the multi-layer wiring board 1. Finally, when bumps which are to be the electronic component terminal 19 and the board terminal 39 are formed on each of the wirings 12 and 32 and the re-wiring electrode 91 of the electronic component 90 is connected to the electronic component terminal 19 to mount the electronic component 90, the multi-layer wiring board 1 of the kind shown in FIG. 1 is completed.

In this way, the multi-layer wiring board 1 according to the present embodiment can be manufactured by the simple manufacturing process of the above-described kind. Specifically, the fact that the fourth printed wiring base 40 can be installed in a printed wiring base using an ordinary electronic component mounting device for installing an electronic component and can be built in to the multi-layer wiring board 1 by collective stacking makes it possible to easily manufacture the multi-layer wiring board 1 in which thinning can be achieved at low cost while reliability of connection is improved without lowering board strength.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-layer wiring board comprising: a plurality of wiring bases; and an adhesive layer interposed between the wiring bases, the respective wiring bases including a wiring pattern on at least one surface thereof and a conductive paste via formed therein, wherein the multi-layer wiring board includes an electronic component terminal and a board terminal having terminal pitch different from that of the electronic component terminal, and the multi-layer wiring board has an electronic component installed thereon and connected to the electronic component terminal, wherein
   the plurality of wiring bases include a first wiring base, a second wiring base, a third wiring base, and a fourth wiring base of similar thicknesses,
   the second wiring base includes an opening in which the fourth wiring base is housed, and is disposed, along with the fourth wiring base housed in the opening, between the first wiring base and the third wiring base, and
   the fourth wiring base has a smaller wiring pitch than those of the first wiring base, the second wiring base, and the third wiring base, is built in to between the first wiring base at a lower portion of an installing portion of the electronic component and the third wiring base, is connected to the electronic component terminal via the conductive paste via of the first wiring base, has formed on both surfaces thereof a pattern that enlarges the terminal pitch from the electronic component terminal to the board terminal, and includes a via that connects the pattern of the both surfaces,
   wherein the fourth wiring base includes first electrodes on one surface thereof facing toward the electronic component and second electrodes on an opposite surface thereof, the respective first electrodes are connected to corresponding one of the second electrodes, and electrode pitch of the first electrodes is smaller than electrode pitch of the second electrodes.

2. The multi-layer wiring board according to claim 1, wherein
   the fourth wiring base is a single layer.

3. The multi-layer wiring board according to claim 1, wherein
   the first wiring base, the second wiring base, the third wiring base, and the fourth wiring base are formed by a resin base.

4. The multi-layer wiring board according to claim 1, wherein
   an outermost electronic component terminal of the electronic component terminals has a terminal pitch enlarged by a pattern continuous with the electronic component terminal of the first wiring base on which the electronic component is installed, to be connected to the board terminal via the conductive paste via without being mediated by the fourth wiring base.

5. The multi-layer wiring board according to claim 2, wherein
   the first wiring base, the second wiring base, the third wiring base, and the fourth wiring base are formed by a resin base.

6. The multi-layer wiring board according to claim 2, wherein
   an outermost electronic component terminal of the electronic component terminals has a terminal pitch enlarged by a pattern continuous with the electronic component terminal of the first wiring base on which the electronic component is installed, to be connected to the board terminal via the conductive paste via without being mediated by the fourth wiring base.

7. The multi-layer wiring board according to claim 3, wherein
   an outermost electronic component terminal of the electronic component terminals has a terminal pitch enlarged by a pattern continuous with the electronic component terminal of the first wiring base on which the electronic component is installed, to be connected to the board terminal via the conductive paste via without being mediated by the fourth wiring base.

8. The multi-layer wiring board according to claim 5, wherein
   an outermost electronic component terminal of the electronic component terminals has a terminal pitch enlarged by a pattern continuous with the electronic component terminal of the first wiring base on which the electronic component is installed, to be connected to the board terminal via the conductive paste via without being mediated by the fourth wiring base.

* * * * *